United States Patent
Roovers

(10) Patent No.: US 6,393,694 B2
(45) Date of Patent: *May 28, 2002

(54) GRIPPING DEVICE

(75) Inventor: Cornelis J. G. Roovers, Mierlo (NL)

(73) Assignee: Koninklijke Philips Electronics N.V., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/510,159

(22) Filed: Feb. 22, 2000

(30) Foreign Application Priority Data

Apr. 23, 1999 (EP) .............................. 99201285

(51) Int. Cl.$^7$ ................................................. H05K 3/30
(52) U.S. Cl. ............................. 29/740; 29/741; 29/759; 29/762; 294/86.4; 294/119.1; 294/106; 901/31; 901/39
(58) Field of Search .......................... 29/740, 743, 741, 29/762, 764, 760, 759; 294/2, 86.4, 64.1, 119.1, 106; 81/341; 901/31, 39

(56) References Cited

U.S. PATENT DOCUMENTS

| | | | | |
|---|---|---|---|---|
| 362,981 A | * | 5/1887 | Leslie | 294/111 |
| 4,336,926 A | * | 6/1982 | Inagaki et al. | 269/34 |
| 4,351,553 A | * | 9/1982 | Rovetta et al. | 294/106 |
| 4,479,673 A | * | 10/1984 | Inaba et al. | 294/88 |
| 4,632,444 A | * | 12/1986 | Martinez et al. | 294/86.4 |
| 4,653,793 A | | 3/1987 | Guinot et al. | 294/86.4 |
| 4,693,505 A | * | 9/1987 | DiMeo | 294/119.1 |
| 4,699,414 A | * | 10/1987 | Jones | 294/119.1 |
| 4,796,357 A | * | 1/1989 | Smith | 29/840 |
| 4,805,951 A | * | 2/1989 | Andersson et al. | 294/116 |
| 4,822,091 A | * | 4/1989 | Vermeer et al. | 294/86.4 |
| 4,839,961 A | * | 6/1989 | Vereem | 29/740 |
| 4,921,293 A | * | 5/1990 | Ruoff et al. | 294/111 |
| 4,957,320 A | * | 9/1990 | Ulrich | 294/106 |
| 5,108,140 A | * | 4/1992 | Bartholet | 294/106 |
| 5,529,359 A | * | 6/1996 | Borcea et al. | 294/88 |
| 5,975,604 A | * | 11/1999 | Wolin et al. | 294/88 |

FOREIGN PATENT DOCUMENTS

| | | | |
|---|---|---|---|
| DE | 3704402 A1 | 10/1987 | |
| EP | 0286178 A2 | 10/1988 | H05K/13/04 |
| JP | 06155358 | 6/1994 | B25J/15/08 |

OTHER PUBLICATIONS

Clayton A Et Al: "Horizontal 3 Finger Robot Gripper" Motorola Technical Developments—Motor Inc. Schaumburg, Illinois, US, vol. 12, Apr. 1, 1991, pp. 11–12.

* cited by examiner

Primary Examiner—Peter Vo
Assistant Examiner—Minh Trinh
(74) Attorney, Agent, or Firm—Steven R. Biren

(57) ABSTRACT

A gripping device for positioning a component (47) on a substrate, comprising three fingers (1, 2, 3) arranged in a triangle (7), and a drive device for moving the fingers along parallel paths (4, 5, 6) relative to each other to grip or release a component. A middle finger (2) is movable in opposite directions with respect to the outer fingers (1, 3).

23 Claims, 3 Drawing Sheets

GRIPPING DEVICE

BACKGROUND OF THE INVENTION

This invention relates to a gripping device for placing a component on a substrate, which gripping device comprises movable fingers and means for making the fingers move relative to each other so as to grip and release the component.

Such a device is known from DE-A1-3704402. This known device comprises two fingers which are arranged right opposite to each other and which can be moved towards each other and away from each other, and by means of which a component can be gripped and released.

SUMMARY OF THE INVENTION

It is an object of the invention to provide a gripping device in accordance with the first paragraph, by means of which components can be reliably and properly gripped.

To achieve this, the gripping device in accordance with the invention is characterized in that three fingers are present, which are arranged in a triangle and which are movable in parallel paths relatively to each other, and in that, viewed in the direction of movement of the fingers, the central finger can be moved in opposite directions with respect to the outer fingers. By arranging the fingers in a triangle, a component is gripped at three locations. As a result, the gripping operation is statically determined. The risk that rotational forces develop which act on the component is small. The component is gripped in a stable and reliable manner. Such a gripping device can be used to grip electric components, but also other components or objects, for example, framework-shaped accessories for electric components, which are to be placed on a substrate or printed circuit board.

A gripping device which is preferably used is characterized in that the distance between the fingers, viewed in the direction of movement of the fingers, is adjustable. By virtue of the adjustability, it becomes possible to adapt the distance between the fingers to the component to be gripped. In general, a component will be gripped on the outside thereof, i.e. the fingers will be moved towards each other in the gripping operation. It is alternatively possible, however, to move the fingers relative to each other such that a component can be gripped on an inside thereof, while for gripping and also for releasing the component, the fingers move in the same direction. The means for driving the fingers do not have to be adjusted.

A further embodiment is characterized in that each finger can be moved by means of two parallel leaf springs. By virtue thereof, the movement of the fingers is substantially without friction.

Yet another embodiment is characterized in that a cap is present which is arranged over the gripping device and which has a wall, wherein parallel grooves are formed through which the fingers project, and which wall serves as a stop for a component to be gripped. As a result, after a component has been placed on a substrate, it is clamped between the wall of the cap and the substrate, and only then the fingers are moved away from each other (or towards each other) to release the component. This leads to a reduction of the risk that, during placing the component, the component is slightly moved when it is released, which could result in an incorrect placement of the component.

These and other aspects of the invention will be apparent from and elucidated with reference to the embodiments described hereinafter.

DESCRIPTION OF THE PREFERRED EMBODIMENTS

Figure 1:
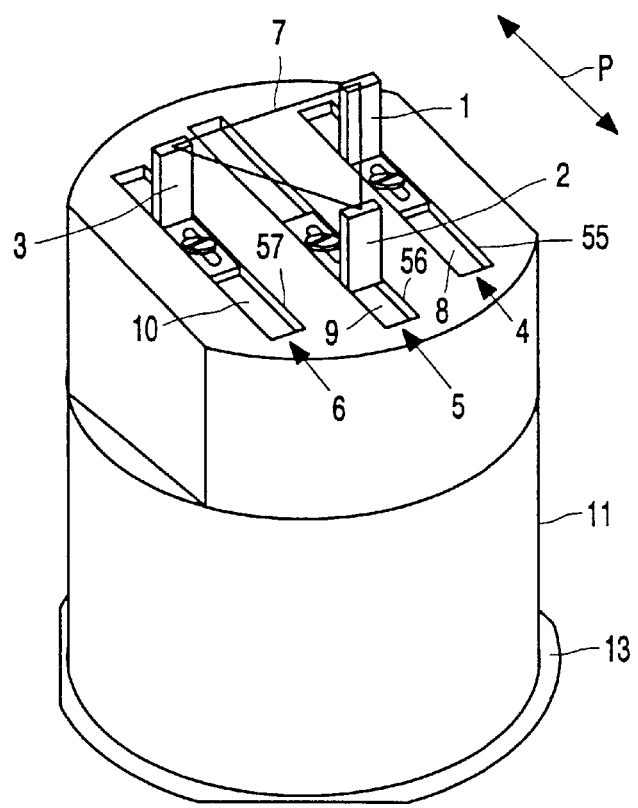
FIG. 1 is a perspective view of a gripping device in accordance with the invention.

FIG. 1 shows a gripping device comprising three fingers 1, 2, 3 which are movable in parallel paths 4, 5, 6 with respect to each other. In operation, the central finger 2 always moves in an opposite direction with respect to the outer fingers 1, 3. The direction of movement of the fingers is indicated by means of an arrow P. The fingers are arranged in a triangle 7. As a result, a component is gripped at three locations. The fingers are each secured onto a respective slide bar 8, 9, 10. A cap 11 is arranged over the gripping device, and is provided with three parallel grooves through which the fingers 1, 2,3 project.

Figure 2:
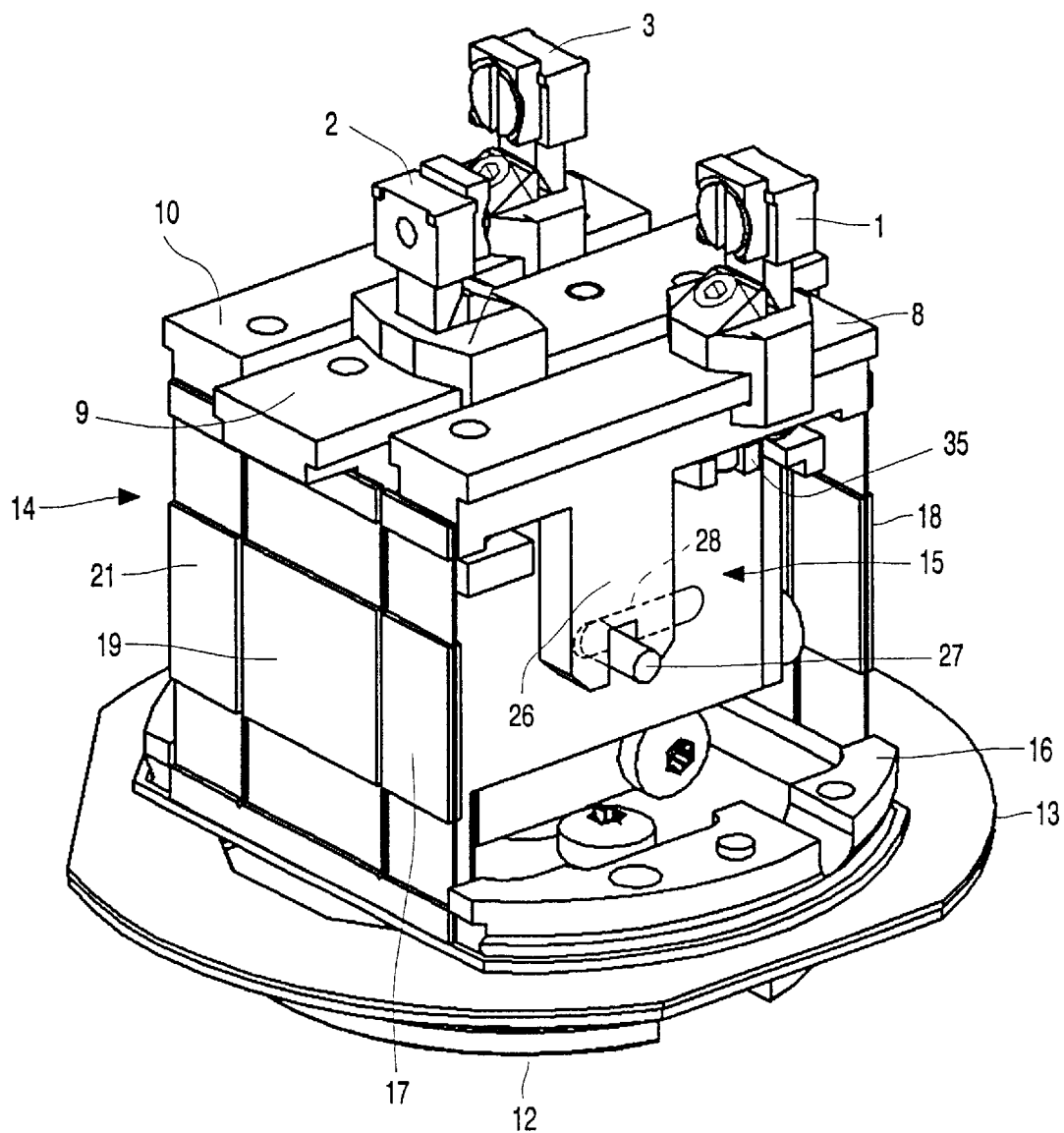
FIG. 2 is a perspective view of the gripping device in a realistic embodiment in accordance with FIG. 1, the cap being removed, FIG. 3 diagrammatically shows, partly in section and partly in a front view, the gripping device shown in FIG. 2.
Figure 3:
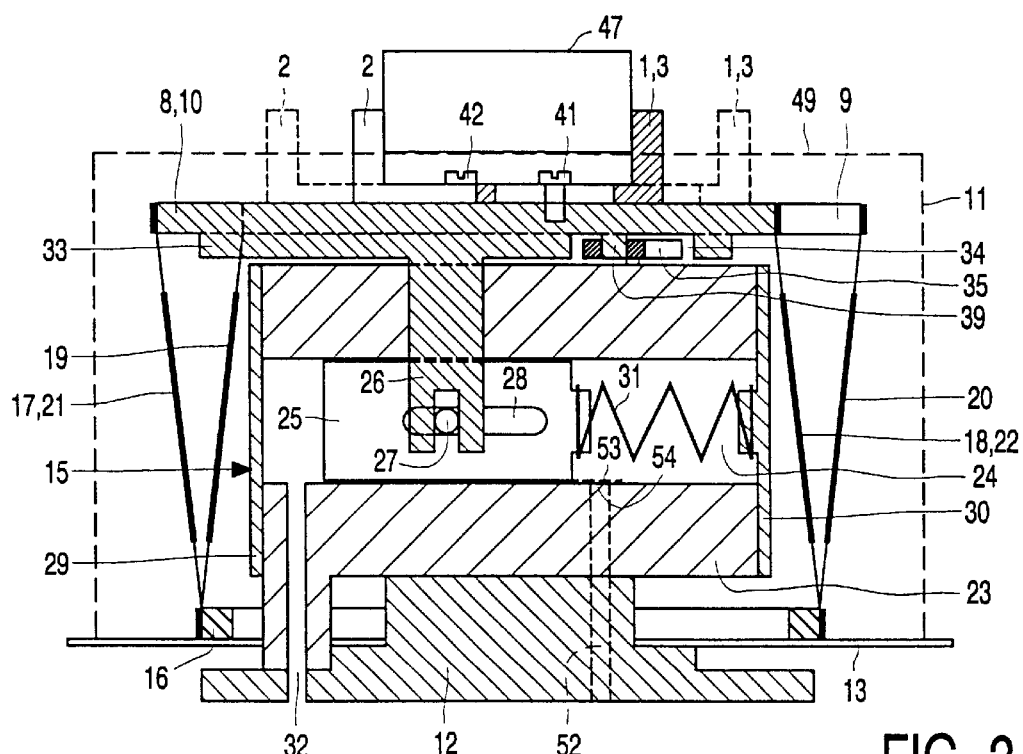
Figure 4:
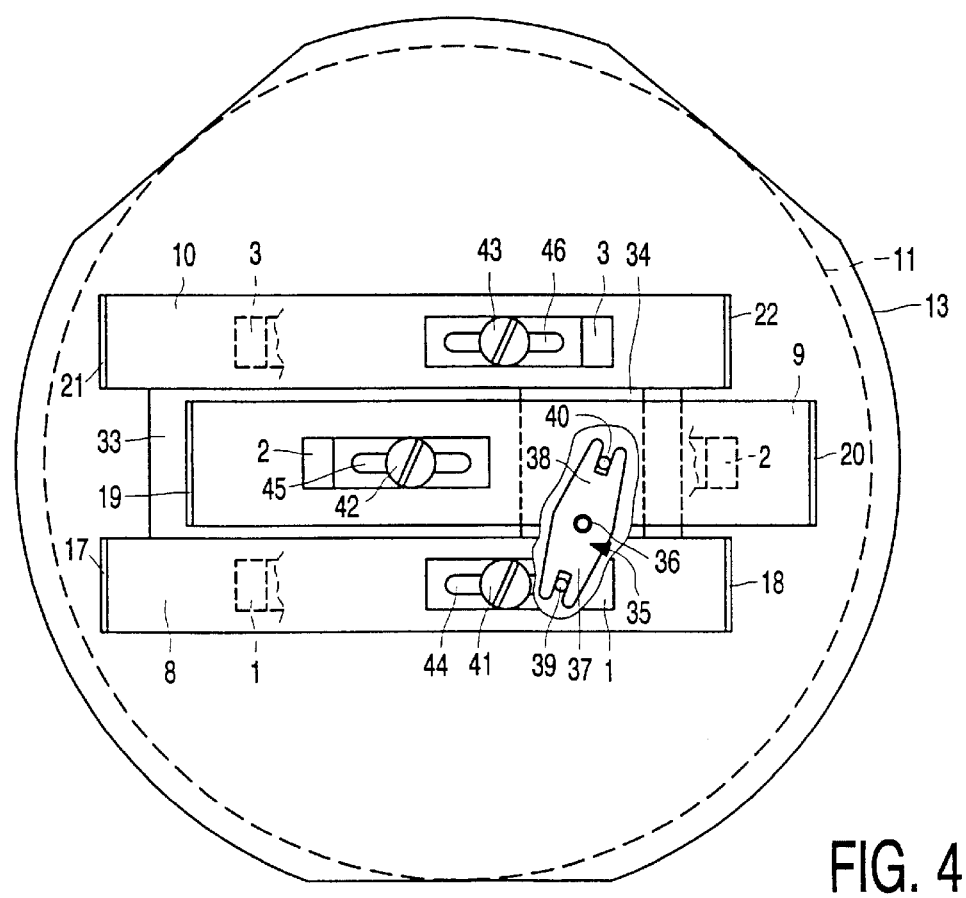
FIG. 4 is a plan view of the gripping device shown in FIG. 3.

FIG. 2 shows the gripping device in a realistic form, the cap 11 being removed. The gripping device is composed of a support 12 on which a supporting plate 13 is secured, a frame 14 comprising the slide bars 8, 9, 10 with the fingers 1, 2, 3, and a drive unit 15 for driving the slide bars. The frame 14 is provided with a supporting element 16 which is secured onto the supporting plate 13. Between ends of each slide bar 8, 9, 10 and the supporting element 16, there are arranged parallel pairs of leaf springs 17, 18; 19, 20; 21, 22, as shown in FIG. 3 and FIG. 4, which also show further details of the gripping device. The leaf springs 17, 18 are secured to one outer slide bar 8, the leaf springs 21, 22 are secured to the other outer slide bar 10, and the leaf springs 19, 20 are secured to the central slide bar 9. The drive unit 15 comprises a cylinder block 23 with a cylinder space 24 and a piston 25 which is movable in the cylinder space. The outer slide bars 8, 10 are coupled to the piston 25 by means of a fork 26. For this purpose, the piston is provided with a pin 27 which is oriented transversely to the direction of movement of the piston and which projects, through an elongated hole 28 of the cylinder block 23, beyond the cylinder block. The fork 26 is coupled to the pin 27. The cylinder space 24 is closed on either side by an end plate 29, 30. At least one compression spring 31 is compressed between the end plate 30 and the piston 25, which compression spring presses the piston to one side, in FIG. 3 the left side. The cylinder block 23 further comprises an air-supply channel 32 which opens into the part of the cylinder space 24 which is situated on the side of the piston 25 opposite the side where the spring 31 is located. The outermost slide bars 8, 10 are connected to each other by means of a bridging piece 33. As a result, the slide bars move simultaneously. The central slide bar 9 is coupled to the outermost slide bar 8. For this purpose, the bridging piece 33 is provided with an opening 34 accommodating a rocker arm 35. This rocker arm 35 can be pivoted about a shaft 36 which is connected to the cylinder block 23. Ends of the rocker arm 35 are provided with a fork 37, 38. The slide bar 8 is provided with a pin 39, and the slide bar 9 is provided with a pin 40. The pin 39 is coupled to the fork 37, and the pin 40 is coupled to the fork 38 of the rocker arm. By virtue of this construction, the central slide bar 9 always moves in the opposite direction relative to the outermost slide bars 8, 10. The fingers 1, 2, 3 are each L-shaped and secured onto the slide bar by means of an adjusting screw 41, 42, 43, which fits in elongated holes 44, 45, 46, respectively, of one of the limbs of the fingers. This enables the fingers to be adjusted with respect to each other in the direction of the paths 4, 5, 6, so as to adapt the distance between the fingers to the component 47 to be gripped.

The operation of the gripping device is as follows: The spring 31 presses the piston 25 to one side, in FIG. 3 the left side. By means of the fork-pin 26–27 construction, the outermost slide bars 8, 10 are also pressed to the left, while the central slide bar 9 is pressed to the right by means of the rocker arm construction 35–40. The fingers 1, 2, 3 move in a corresponding direction, so that the component 47 can be clamped between the fingers. If, subsequently, compressed air is connected to the supply channel 32, which exerts a greater pressure on the left side of the piston 25 than the pressure exerted on the right side of the piston by the spring 31, then the piston will move to the right and the outer fingers 1, 3 will move to the left and the central finger 2 will move to the right, as indicated by means of an interrupted line. The component 47 is released.

In the above description of the operation of the gripping device, a component is gripped at the outer surfaces of the component. It is alternatively possible to grip a component or a specific accessory for a component at the inner surfaces. For this purpose, the position of the fingers on the slide bars is changed, as indicated by means of interrupted lines in FIG. 4. The L-shaped fingers 1, 3 are rotated through 180° and secured onto the slide bar 8, 10, at a location further to the left, while the L-shaped finger 2 is also rotated through 180° and secured onto the slide bar 9, at a location further to the right. The movements of the fingers for gripping or releasing a component are the same as the movements described in the preceding paragraph.

Figure 5:
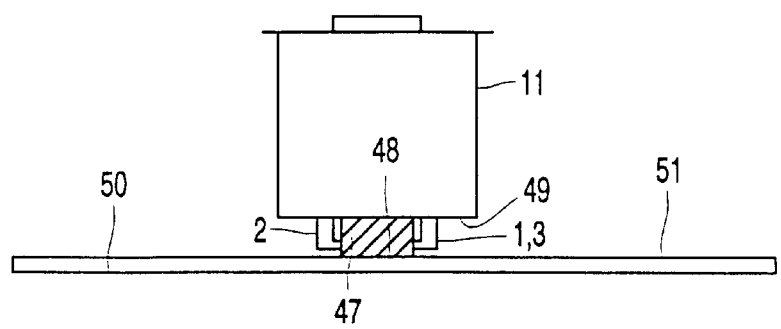
FIG. 5 shows a situation wherein the gripping device places a component on a substrate.

Apart from a protective function, the cap 11 also has a stop function (see FIG. 5). When a component 47 is lifted up, an outer surface 48 of the component engages the wall 49 of the cap 11. When the component is placed, for example, on a printed circuit board 50, the component is clamped for a short period of time between the wall 49 of the cap and the surface 51 of the printed circuit board. Only then is the component released by the fingers, and subsequently the gripping device is moved away from the printed circuit board. In this manner, it is precluded that during placing a component on a printed circuit board, said component could still be moved by the moving fingers.

It is also possible to provide the gripping device with a built-in detection system by means of which it can be detected whether a component has been lifted up improperly or not at all. As indicated in FIG. 3 by means of an interrupted line, this may be achieved, for example, by providing an air suction channel 52 which extends to the space of the cylinder 24 where the spring 31 is situated, i.e. on the other side of the piston 25, opposite to where the supply channel 32 is situated. The piston 25 is provided with a foil-like shut-off element 53 by means of which the suction channel 52 can be closed. In FIG. 3, a component 47 is gripped by the fingers. A vane closes the opening 54 of the suction channel. The partial vacuum in the suction channel does not have any effect on gripping the component. However, if there is no component, then the spring 31 presses the piston further to the left, so that the shut-off element 53 no longer closes the opening 54. By means of a pressure measurement, it can be determined whether a component has been properly gripped, improperly gripped, or not gripped at all. The detection means for measuring a pressure difference are not shown in greater detail. These means are known per se.

What is claimed is:

1. A gripping device for placing a component on a substrate, wherein the gripping device comprises: three movable fingers comprising a central finger and two outer fingers arranged in a triangle, and means for moving the fingers relative to each other so as to grip and release the component, characterized in that said fingers are movable in parallel paths relative to each other, and in that, viewed in the direction of movement of the fingers, the central finger is movable in opposite directions with respect to the outer fingers, and two parallel leaf springs arranged to move each finger.

2. The gripping device as claimed in claim 1, further comprising: means for synchronously adjusting the distance between the central finger and the two outer fingers as viewed in the direction of movement of the fingers.

3. The gripping device as claimed in claim 1, further comprising a cap at the top of the gripping device and which has parallel grooves through which the fingers project, and the cap has a wall which serves as a stop for a component to be gripped.

4. The gripping device as claimed in claim 1, further comprising: means for coupling the outer fingers to each other.

5. The gripping device as claimed in claim 1, wherein the outer fingers are situated on an imaginary line extending between the two outer fingers and which is perpendicular to the direction of movement.

6. The gripping device as claimed in claim 1, wherein the paths along which the fingers are movable are situated at equal distances from each other.

7. The gripping device as claimed in claim 1, further comprising: said springs being arranged so that the fingers grip the component under the influence of a spring force.

8. The gripping device as claimed in claim 7, further comprising: a pneumatic source acting on the fingers such that the fingers release the component under the influence of a pneumatic force which acts in a direction opposite to that of the spring force.

9. The gripping device as claimed in claim 7, further comprising: a pneumatic source coupled to the movable fingers via first and second air channels for generating a pneumatic force to move the fingers, detection means which comprise a shut-off mechanism for closing the second air channel, means coupling the shut-off mechanism to at least one of the movable fingers, and a sensor which detects a pressure difference in the second air channel when no component has been gripped or when a component has been gripped incorrectly.

10. The gripping device as claimed in claim 4 further comprising second means for coupling the central finger to one outer finger in a manner such that the central finger is constrained to move in a direction opposite to that of the two outer fingers.

11. The gripping device as claimed in claim 1 further comprising:
    means for coupling the three fingers to one another so that they are constrained to move simultaneously in an interdependent manner, and
    a drive system for moving the three fingers simultaneously.

12. The gripping device for placing a component on a substrate, the device comprising:
   a central finger and first and second outer fingers arranged together to form a triangle,
   means for coupling the three fingers in a manner such that they are constrained to move simultaneously,
   means for simultaneously moving the three fingers in parallel paths so as to grip and release the component, the first and second outer fingers always moving in the same direction and the central finger always moving in an opposite direction to that of the first and second outer fingers, said means for simultaneously moving the three fingers comprising two leaf springs for each finger.

13. The gripping device as claimed in claim 12 further comprising:
   means for coupling the central finger to one outer finger in a manner such that the central finger is constrained to always move in a direction opposite to that of the two outer fingers.

14. The gripping device as claimed in claim 12 wherein:
   the three fingers are coupled to one another in a manner such that the central finger is constrained to always move in a direction opposite to that of the two outer fingers.

15. The gripping device as claimed in claim 14 wherein said coupling means keeps the distance from the first outer finger to the central finger and the distance from the second outer finger to the central finger in-a fixed ratio.

16. The gripping device as claimed in claim 12 further comprising:
   means for individually adjusting the position of the fingers along their respective parallel paths.

17. The gripping device as claimed in claim 12 further comprising:
   a central slide bar and first and second outer slide bars to which are mounted the central finger and the first and second outer fingers, respectively,
   first means coupling the first and second outerslide bars together so that they move together in said parallel paths,
   second means coupling the central slide bar to one of the outer slide bars and including a rocker arm unit that constrains the central slide bar to move in an opposite parallel path to that of the parallel paths of the first and second outer slide bars, and
   third means for coupling the means for moving to at least one of the outer slide bars.

18. The gripping device as claimed in claim 17 wherein the means for moving comprises:
   a cylinder block having a cylinder space therein,
   a piston movable within the cylinder space,
   a compression spring coupled to one side of the piston to press it to move in one direction within the cylinder space,
   an air channel coupled to the cylinder space on the opposite side of the piston and coupled to a source of air pressure which acts on the piston in a direction opposite to said one direction.

19. The gripping device as claimed in claim 18 comprising:
   an air suction channel coupled to the cylinder space at said one side of the piston, and
   a shut-off device for opening and closing the air suction channel as a function of the position of the piston within the cylinder space.

20. The gripping device as claimed in claim 12 further comprising:
   a cap at the top of the gripping device and which has three parallel channels through which respective ones of the fingers project so as to move along their respective parallel paths, and the cap has a wall for engagement with a component to be gripped.

21. The gripping device as claimed in claim 12 further comprising:
   a first pair of leaf springs coupled to the central finger for moving it along its parallel path,
   a second pair of leaf springs coupled to the first outer finger for moving it along its parallel path, and
   a third pair of leaf springs coupled to the second outer finger for moving it along its parallel path.

22. The gripping device as claimed in claim 12 further comprising:
   means for coupling the three fingers to one another so that they move simultaneously along their respective parallel paths, wherein the parallel path for the central finger is equi-distant from the respective parallel paths for the first and second outer fingers.

23. The gripping device as claimed in claim 12 further comprising:
   a drive system coupled to said means for simultaneously moving the three fingers, and wherein
   each of the three fingers has a flat surface arranged to contact and grip a component to be placed on the substrate.

* * * * *